United States Patent [19]

Sher et al.

[11] Patent Number: 4,529,832
[45] Date of Patent: Jul. 16, 1985

[54] LEAD-CADMIUM-SULPHIDE SOLAR CELL

[75] Inventors: Arden Sher, Belmont; John B. Mooney, San Jose, both of Calif.

[73] Assignee: Savin Corporation, Stamford, Conn.

[21] Appl. No.: 581,783

[22] Filed: Feb. 21, 1984

[51] Int. Cl.$^3$ .............................................. H01L 31/06
[52] U.S. Cl. ................................... 136/260; 136/265; 357/16; 357/30; 427/74; 427/87
[58] Field of Search ................. 136/260, 265, 255; 357/16, 30, 15

[56] References Cited

U.S. PATENT DOCUMENTS

| | | | |
|---|---|---|---|
| 3,261,726 | 7/1966 | Ruehrwein | 148/33.4 |
| 3,900,431 | 8/1975 | Kobayashi et al. | 252/501 |
| 4,341,851 | 7/1982 | Mooney | 430/56 |

OTHER PUBLICATIONS

J. D. Jensen et al., *J. Electronic Mat'ls*, vol. 7, pp. 237–252 (1978).
A. K. Sood et al., *Thin Solid Films*, vol. 48, pp. 73–94 (1978).
A. K. Sood et al., *J. Appl. Phys.*, vol. 49, pp. 5292–5294 (1978).
T. Kobayashi et al., *J. Phys. Chem. Solids*, vol. 40, pp. 781–785 (1979).
S. Wagner, *Conf. Record, 16th IEEE Photoroltaic Specialist Conf.* (1982), pp. 685–691.

*Primary Examiner*—Aaron Weisstuch
*Attorney, Agent, or Firm*—Shenier & O'Connor

[57] ABSTRACT

A solar cell in which the essential feature is a thin film of lead-cadmium-sulphide alloy. This alloy is preferably formed by spray pyrolysis from a solution containing the necessary ingredients. The solar cell advantageously takes the form of a homojunction constructed of two layers of lead-cadmium-sulphide alloy, with one of the layers being p-doped and the other of the layers being n-doped. The solar cell may be produced with an intrinsic layer interposed between the p-type layer and the n-type layer. The solar cell may also be made with a semiconductive layer of lead-cadmium-sulphide in contact with a metallic substrate.

13 Claims, 7 Drawing Figures

LEAD-CADMIUM-SULPHIDE SOLAR CELL

BACKGROUND OF THE INVENTION

Fossil fuels available on earth are limited. The most convenient form of fossil energy is liquid hydrocarbon. Coal, which is a solid hydrocarbon, must be mined. Furthermore, it is difficult to refine coal to remove sulphur. The result is that the combustion of sulphur-bearing coal produces sulphur oxides which introduce acid rain into the earth's atmosphere.

Power plants designed to utilize nuclear fission will produce energy. However, there is always the risk of a nuclear accident which releases ionizing radiations to the atmosphere. Furthermore, there is the problem of disposing of nuclear wastes. Physicists have long realized that the sun is a nuclear power plant which produces an enormous quantity of radiant energy. Less than a billionth of this energy is intercepted by the earth, and only about 60 percent passes through the atmosphere to warm the earth's surface. If it were possible to utilize 10 percent of the radiant energy from the sun, impacting on a plot of land having an area of approximately 8800 square miles, the energy achieved would equal the electrical power generated by all of the power plants in the United States.

Before the art of solid-state physics had reached its present level, scientists had attempted to generate power by converting sunlight to heat, using the heat to generate steam and, ultimately, employ the steam to drive electrical generators. It is now possible to convert sunlight directly into electricity by solar cells. These devices are advantageous for a number of reasons. First, they are non-polluting; second, they have a potentially long life; and third, they require minimum maintenance and have no moving parts. The physical principles of solar cells are well known. They have been reliably used in the space program; they have been used in radio-relay stations, navigational aids, and intrusion alarms; and they have been used even to power watches. The commercial use of solar cells is greatly limited because of the cost of the cells.

All solar cells are essentially solid-state rectifiers. A semiconductor-wafer may be doped with a small concentration of dopant so that it will conduct electricity. Most semiconductors, such as silicon, are poor conductors. Depending on the nature of the dopant, silicon will conduct negative charges (electrons) or positive charges (holes). When radiant energy from the sun strikes a solar cell made of silicon, the electrons will move towards the n-type silicon and the holes toward the p-type silicon. The separation of the two charges will produce a voltage, roughly, of about 0.5 volt. While the voltage produced is independent of the area, the current produced is proportional to the area. The efficiency of a typical silicon solar cell lies between 10 and 18 percent.

There are many types of solar cells. Semiconductors, which may be doped either p-type or n-type, may be made of a single crystal such as Si or GaAs. Polycrystalline semiconductors may involve solar cells formed of heterojunctions, such as $p-CuInSe_2/n-CdS$.

1. Field of the Invention

Our invention relates to solar cells—that is, photovoltaic devices adapted to transform photons directly into electrical potential.

2. Description of the Prior Art

The first solar cell was invented by Chapin, Fuller, and Pearson (U.S. Pat. No. 2,780,765). This disclosed a p-n junction in single-crystal silicon. These devices form the basis of solar cells in commercial use today. The limitation to the growth of use of solar cells is cost. The present cost of a silicon solar cell is approximately ten dollars per peak watt. To manufacture a silicon solar cell requires the reduction of sand (silicon dioxide) into metallurgical silicon. This metallurgical silicon must then be converted into an intermediate compound, such as a silane, which must then be purified. The intermediate compound—as, for example, trichlorosilane—must be converted into polycrystalline silicon, which must be very pure. The purified silicon is then melted at 1410° C. and crystallized by the Czochralski method. This embodies contacting the melt with a small seed of a single crystal, followed by adjustment of the temperature to initiate growth. The growing crystal is then pulled away from the molten silicon as it grows, gradually consuming the silicon. The silicon is continuously replenished in crystal-growing apparatus now in use. The result is a single crystal which is typically 4 inches in diameter and 3 feet long. The individual silicon cells are then prepared by slicing the crystal into wafers 4 inches in diameter and 0.02 inch thick. Approximately one-third to one-half of the expensively acquired silicon is thus lost in costly sawdust. These wafers are then processed to produce a p-n junction and complete the device.

An alternate method of preparation is to pull a flat ribbon of silicon from the melt through a graphite die (U.S. Pat. No. 4,036,666 to Mlavsky). The thin-ribbon method reduces the cost, owing to the saving of time, energy, and material. However, there is some loss in crystal quality, which results in a less efficient cell. Then, too, the cost remains relatively high, since purification and the high-temperature melting steps are still present in the process.

A lower-cost type of solar cell employs thin films, in which the p-region and the n-region are applied to a substrate which furnishes the structural support for the thin film. A comprehensive review of thin-film research is presented in the *Proceedings of the 16th I.E.E.E. Photovoltaic Specialists Conference* (1982), beginning at page 840 and extending through page 845. In contrast to the bulk of a silicon wafer (0.02 inch thick), thin-film solar cells provide p- and n-regions which are only 0.0005 inch thick or less. This requires that the films be deposited on a substrate, which may be made of metal or metal-coated ceramic. One example of a thin-film solar cell is disclosed in U.S. Pat. No. 3,416,956 to Keramidas et al. Cadmium sulphide (CdS) is deposited on a substrate by vacuum evaporation, and copper sulphide ($Cu_2S$) is formed by ion exchange with a cuprous chloride ($Cu_2Cl_2$) solution. The resulting $CdS/Cu_2S$ layers form a heterojunction cell which may have more than a 10-percent photovoltaic efficiency. However, this cell is chemically unstable and will degrade within hours to months, depending on its encapsulation. More suitable thin-film solar cells are n-CdS/p-CdTe. These solar cells, however, suffer from contact degradation of the CdTe layer. Another thin-film solar cell, $n-CdS/p-CuInSe_2$, has been made to produce a 10-percent solar efficiency and demonstrate stability. However, this cell suffers the disadvantage of being very expensive to prepare, since a three-source vacuum evaporation technique is required. A very different thin-film cell is fabricated from amorphous silicon. This, however, requires the same expensive silicon purification process. There is a saving in cost which ensues because of the thin film used—namely, a layer of thickness of $2.4 \times 10^{-5}$ inches. The advantages, however, are offset because amorphous silicon cells suffer a 10-percent degradation in the very first month of their use.

Cadmium sulphide, as an n-layer of thin-film cells, has been studied in depth, since CdS is a very well-understood semiconductor which has excellent electrical properties in the thin-film form. However, it must be combined with a second layer that is p-type and is an efficient absorber of sunlight. This is owing to the fact that CdS has a wide band gap and absorbs little of the solar spectrum. Crystalline silicon also has a relatively low absorption coefficient and hence requires a layer which is at least 0.02 inch thick so that sufficient sunlight will be absorbed. $CuInSe_2$, CdTe, and $Cu_2S$ are very strong absorbers across the entire solar spectrum. The advantage of this is that the photons of sunlight are all absorbed in a very thin layer of less than $4 \times 10^{-5}$ inches. Consequently, the resultant electrons and holes do not have a long distance to travel to reach the electrode. Since thin films are of poor crystalline quality relative to single-crystal silicon, it is important to have the shortest possible path for the electrons or holes. Otherwise, many of these carriers are lost at the crystalline imperfections that are present in thin films that are comprised of very small crystallites. The boundary between grains is a very significant imperfection in this sense, and the thinner the layer, the fewer grain boundaries that must be traversed.

All of the thin-film solar cells discussed above have been heterojunctions which are formed between two semiconductor regions that are chemically different. There are two major advantages of a heterojunction. If one region has a greater band gap, as CdS does in a $CuInSe_2$/CdS cell, it absorbs little of the sunlight. Thus, light incident on the CdS side efficiently reaches the interface where, due to the small absorption depth of the p-region $CuInSe_2$, it is likely that absorption will occur, and the resulting electron-hole pairs are separated by the field that is created by the junction. In some semiconductors, such as CdS, a p-n junction can only be formed by a heterojunction because it can only be doped n-type. The charge-transport properties of CdS are very good in thin films, and it has been used in combination with a p-type semiconductor of the desired 1.0–1.6 e.v. band gap. A solar cell employing a heterojunction suffers from the discontinuity between the two layers. There is interference with charge transport, owing to the presence of traps or recombination sites for carriers. Another problem is a conduction-band discontinuity or spike, or both, which results from the differences in the electron affinities of the two semiconductors. The electron affinity is measured from the bottom of the conduction band to the vacuum level, which is the energy level above which an electron can escape from the solid. If the junction is improperly designed and the electron affinities of the two semiconductors are not closely matched, then barriers or spikes may exist in either the valence band or the conduction band, or both. It is believed that these features will decrease the efficiency of a heterojunction solar cell.

SUMMARY OF THE INVENTION

We have discovered that lead-cadmium-sulphide $(Pb_xCd_{(1-x)}S)$ may be doped either positive or negative. We became familiar with the properties of lead-cadmium-sulphide alloy in connection with our work in respect of a multilayer photoconductive assembly with an intermediate heterojunction, described in our U.S. Pat. No. 4,343,881, issued Aug. 10, 1982. We form a thin layer of lead-cadmium-sulphide alloy, between 0.1 and 1 micron thick, by spray pyrolysis, as described in Hill et al U.S. Pat. No. 3,148,084 and in our U.S. patent identified above. This layer, as will be understood, is deposited on a supporting layer, which may be glass, metal, or ceramic. The alloy may be represented by the formula $Pb_xCd_{(1-x)}S$ and may be n-doped with indium, aluminum, or chlorine atoms or with sulphur vacancies. The lead-cadmium-sulphide alloy layer may be p-doped with Group V elements such as antimony and arsenic as acceptors or with copper as another acceptor. If the concentration of lead is the same in the n-type and p-type layers, a homojunction is formed. If the concentration of lead is different in the n- and p-layers, a heterojunction is formed. It is known that cadmium sulphide can be doped n-type but cannot be doped p-type. Accordingly, a heterojunction may be formed with lead-cadmium-sulphide alloy as the p-type layer and cadmium sulphide, without the lead, as the n-type layer.

While we prefer to use spray pyrolysis, we are able to practice our invention by vacuum deposition of the layers onto the substrate. We have determined that the range of x in lead-cadmium-sulphide alloy $(Pb_xCd_{(1-x)}S)$ should lie between 0.3 and 0.7. In the n-type layer, represented by the formula $Pb_yCd_{(1-y)}S$, y may be less than x and the lead may be eliminated completely by making y zero.

We are able to form solar cells which may fall in the following categories: A homojunction solar cell in which there is an intrinsic layer intermediate the p-type layer and the n-type layer; a homojunction solar cell formed on an opaque substrate instead of a transparent one; a Schottky-barrier solar cell formed by the junction of a lead-cadmium-sulphide layer with a metallic conductive layer; and a Schottky-barrier cell which is comprised of a metallic substrate and a semiconductive layer of lead-cadmium-sulphide with an insulator interposed between the metallic substrate and the lead-cadmium-sulphide layer. The lead-cadmium-sulphide layer may be doped either p-type or n-type.

OBJECTS OF THE INVENTION

One object of our invention is to produce a semiconductor which has an ideal band gap for solar absorption, utilizing the appropriate value of x in a lead-cadmium-sulphide alloy having the general formula $Pb_xCd_{(1-x)}S$.

Another object of our invention is to produce a lead-cadmium-sulphide alloy semiconductor, adapted for the construction of a solar cell, which is a p-type material and which has charge-transport properties closely similar to n-type cadmium sulphide.

Still another object of our invention is to produce a homojunction in a cadmium-sulphide-like semiconductor which will retain the advantage of cadmium sulphide and avoid the problems associated with a heterojunction.

A further object of our invention is to produce a thin-film solar cell from inexpensive and abundant chemical elements available in high purity and at low cost.

BRIEF DESCRIPTION OF THE DRAWINGS

In the accompanying drawings, which form part of the instant specification and which are to be read in conjunction therewith, and in which like reference numerals are used to indicate like parts in the various views.

DESCRIPTION OF THE PREFERRED EMBODIMENT

The preferred embodiment of our invention comprises a homojunction employing lead-cadmium-sulphide in the two contacting layers which form the solar cell. It is understood that the essential feature is the presence of lead-cadmium-sulphide. We have discovered that lead-cadmium-sulphide may be doped either p-type or n-type.

Figure 1:
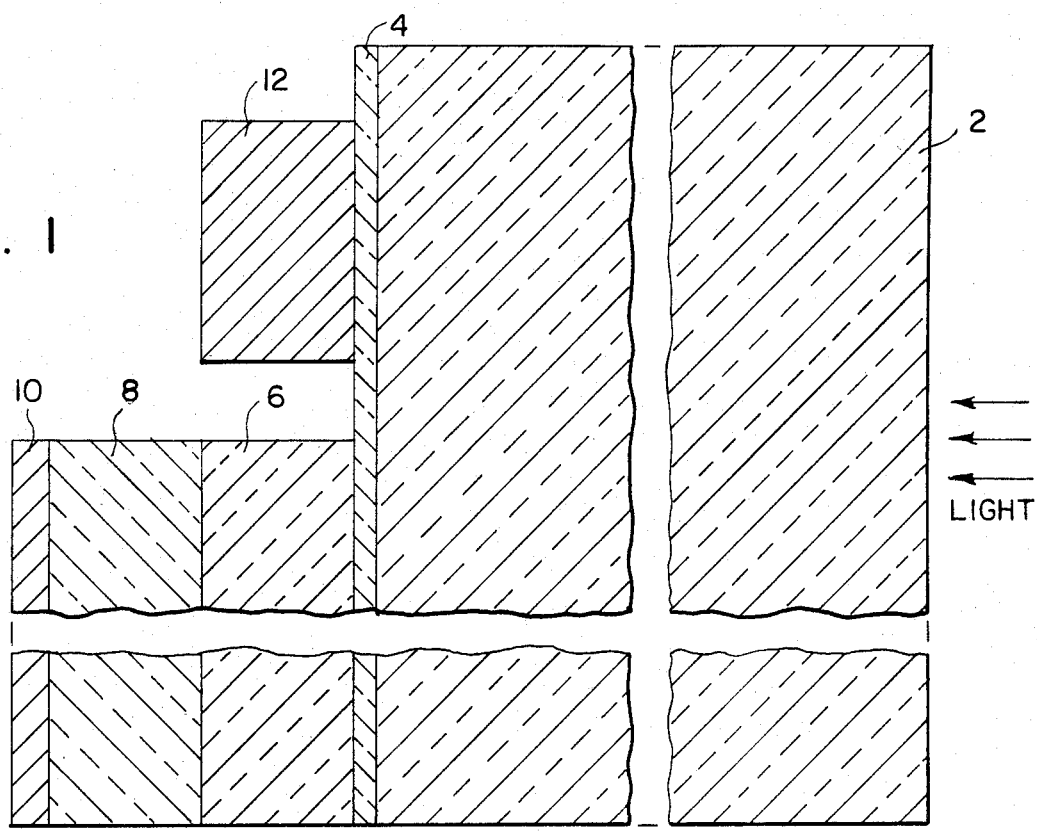
FIG. 1 is a diagrammatic view showing a homojunction solar cell.

Referring now to FIG. 1, the layer 2 is a glass substrate. The layer 4 comprises a transparent conductor, typically, tin oxide. The layer 6 comprises lead-cadmium-sulphide having the general formula $Pb_xCd_{(1-x)}S$, which is n-doped. Layer 8 comprises lead-cadmium-sulphide having the general formula $Pb_xCd_{(1-x)}S$, which is p-doped. If the concentration of lead is the same in layers 6 and 8, we have a homojunction. If the concentration of lead is unequal in the interfacing lead-cadmium-sulphide layers, we have a heterojunction. It is understood that layer 6 must be more transparent than layer 4. If x equals 0 in layer 6, the heterojunction will be a $Pb_xCd_{(1-x)}S/CdS$ solar cell.

The typical thicknesses of the layers in FIG. 1 and in the other FIGURES are shown in the following table:
Glass layer 2 . . . 3.175 mm
Tin oxide layer 4 . . . 0.00025 mm
n-layer 6 . . . 0.0001 mm
p-layer 8 . . . 0.0001 mm
p-contact 10 . . . 0.0005 mm
n-contact 12 . . . 0.002 mm The p-region contact 10, in FIG. 1, may comprise gold, nickel, or chromium. The n-region contact, in FIG. 1, may comprise aluminum. Layers 6, 8, and 10 may be about 15 mm wide and 100 mm long in the direction into the page. The negative contact layer 12 may be about 3 mm wide and, similarly, 100 mm long.

Figure 6:
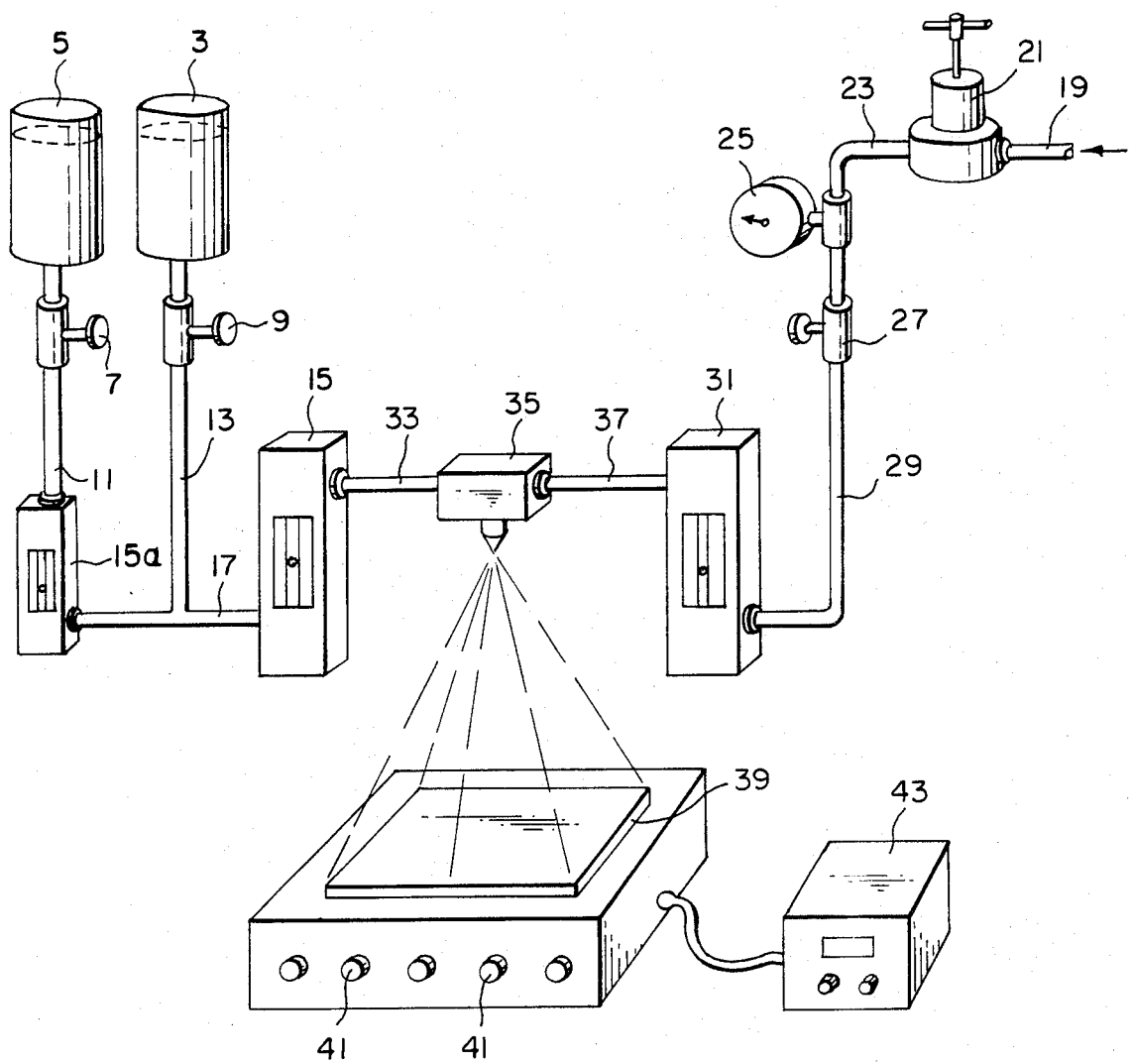
FIG. 6 is a schematic view showing one form of apparatus adapted to carry out the method of our invention and produce the solar cell of our invention.

Referring now to FIG. 6, we employ spray pyrolysis—a method which is known to the art, is described in Hill et al Pat. No. 3,148,084, and is further described in our Pat. No. 4,343,881. Co-inventor John B. Mooney is the co-author of a paper captioned "SPRAY PYROLYSIS PROCESSING", which is reported at pages 81-101 of Volume 12 of *Ann. Rev. Mater. Sci.*, published by Annual Reviews Inc. in 1982. This publication is an exhaustive disclosure of the spray pyrolysis process for obtaining thin films by spraying a solution on a heated surface on which the constituents react to form a chemical compound. Spray solutions, which will be described hereinafter, are supplied from reservoirs 3 and 5. Two reservoirs are shown where a graded heterojunction is desired. In the apparatus which we have used, each of the reservoirs holds approximately 500 cc of the solution. The flow of the solutions is controlled by valve 7 through pipe 11 and flow meter 15a and by valve 9 through pipe 13 which joins pipe 17 for passage through flow meter 15. Compressed air from a suitable source (not shown) is introduced through pipe 19 past an air pressure control valve 21 to pipe 23, the pressure in which is indicated by an air pressure gauge 25. A needle valve 27 controls the air flow, passing through pipe 29 to a gas flow meter 31. The liquid to be sprayed leaves the flow meter 15 through pipe 33 and passes through a spray nozzle 35, which is aspirated by air, leaving the gas flow meter through pipe 37. The plate 39 is made of glass, in the form of the invention shown in FIG. 1, and is maintained at a temperature of between 150° C. and 300° C. The optimum temperature is in the vicinity of 200° C. The heat is supplied by electrical resistance heating elements 41, the temperature of which is controlled by a temperature-controlling assembly 43, which is known to the art. It will be understood, of course, that if a homojunction solar cell is to be made, a single reservoir may be employed.

EXAMPLE I

In the form of the invention employing a graded heterojunction—that is, one where the value of x in layer 6 of FIG. 1 is different from the value of x in layer 8—it will be necessary to employ two solutions for layer 6. It will be understood that the glass substrate 39, in FIG. 6, will have an area of 16 square inches, the plate being 4 inches on a side. The dynamic mixture of the two solutions for layer 6 will aggregate about 500 cc. The reservoir 3 will contain about 350 cc of a solution having the following composition:
0.003 molar Cadmium Acetate
0.00003 molar Indium Chloride
0.009 molar Thiourea The reservoir 5 will contain about 150 cc of a solution having the following composition:
0.003 molar Lead Acetate
0.00003 molar Indium Chloride
0.009 molar Thiourea Before the air or inert gas is permitted to flow through control valve 21 and the apparatus is ready for operation, the glass substrate 39 is provided with a tin oxide layer. Plate 39 corresponds to substrate 2 in FIG. 1, and the tin oxide layer 4 has been deposited on plate 39 by vacuum deposition, as is well known to the art. It is to be understood that, instead of by vacuum deposition, thin films may be deposited by spray pyrolysis. This has been disclosed by J. M. Mochel in U.S. Pat. Nos. 2,564,706; 2,564,707; 2,564,708; 2,564,709; 2,564,710; and 2,564,987. It will be observed that the substrate 2 also bears an n-region contact, shown at 12 in FIG. 1. A typical contact would be aluminum, indium, or other electro-positive metal, which is deposited by vacuum evaporation, as is known to the art. The spraying is started by opening needle valve 7 at a liquid flow rate of 5 cc per minute, as indicated by both flow meters 15 and 15a. It is continued for 40 minutes, during which time needle valve 9 is closed. For the next 40 minutes, needle valve 7 is slowly closed, so that the flow from reservoir 5 is reduced to a rate of 2.5 cc per minute. During this time, the flow from reservoir 3 is started and slowly increased to 2.5 cc per minute by opening needle valve 9. This will be reached when flow meter 15a shows 2.5 cc per minute and flow meter 15 shows 5 cc per minute. During this operation, the value of x in the layer 6 of lead-cadmium-sulphide is increased from 0 to 0.5. For the final 40 minutes, liquid from both reservoirs 3 and 5 will flow at a rate of 2.5 cc per minute and the value of x in the lead-cadmium-sulphide will be 0.5. It is understood, of course, that concomitantly with the opening of the needle valves, air pressure is employed to aspirate the solutions through spray nozzle 35. This is done by opening the pressure control valve 21. The flow rate is governed, not only by the needle valves, but also by the air pressure.

To form layer 8, in FIG. 1, only one reservoir is used, and it contains 500 cc of the following solution:
0.003 molar Lead Acetate
0.003 molar Cadmium Acetate
0.006 molar Thiourea
0.00003 molar Antimony Chloride
The same procedure is followed, as described above, with the exception that the period of flow is continued for 80 minutes. Layer 8, which is a p-layer, is furnished with a contact 10 which may be gold, nickel, chromium, or other electro-positive metal. This is deposited by vacuum evaporation through a mask (not shown) to define the contact area.

EXAMPLE II

In this example, a homojunction, the value of x in layer 6 is 0.5, as it is in layer 8. The following solution is used for the spraying of layer 6:
0.003 molar Lead Acetate
0.003 molar Cadmium Acetate
0.00003 molar Indium Chloride
0.009 molar Thiourea
The following solution is used for the spraying of layer 8:
0.003 molar Lead Acetate
0.003 molar Cadmium Acetate
0.006 molar Thiourea
0.00003 molar Antimony Chloride
The procedure of Example I is followed. Each layer is formed with 500 cc of the respective p-doped and n-doped solutions.

EXAMPLE III

This example shows the making of a homojunction solar cell, in which both layers are lead-cadmium-sulphide having the formula $Pb_xCd_{(1-x)}S$, and in which the value of x is 0.4 in both layers. The following solution is used for the spraying of layer 6:
0.0024 molar Lead Acetate
0.0036 molar Cadmium Acetate
0.00003 molar Indium Chloride
0.009 molar Thiourea
The following solution is used for the spraying of layer 8:
0.0024 molar Lead Acetate
0.0036 molar Cadmium Acetate
0.006 molar Thiourea
0.00003 molar Antimony Chloride
Each layer is formed with 500 cc of the respective p-doped and n-doped solutions.

EXAMPLE IV

Figure 2:
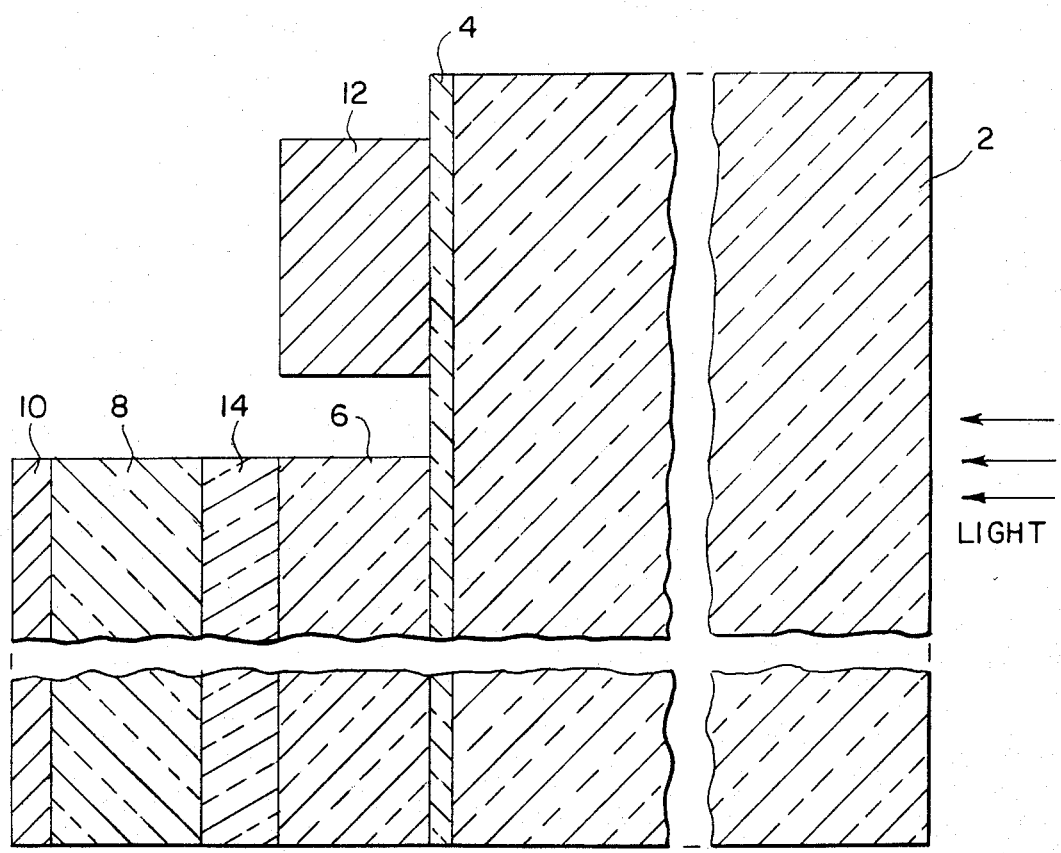
FIG. 2 is a diagrammatic view showing a PIN (p-layer—intrinsic layer—n-type layer) solar cell.

Referring now to FIG. 2, we have shown a solar cell having a p-doped layer, an intrinsic layer, and an n-doped layer, identified by the acronym "PIN". This solar cell is in all respects the same as the homojunction solar cell shown in FIG. 1, with the exception that there is a layer 14 of lead-cadmium-sulphide which is intrinsic—that is, a lead-cadmium-sulphide layer which is not doped with either donor or acceptor impurities. When an intrinsic layer is lodged between an n-type and a p-type layer, it tends to extend the length of the region in which there is an electric field. This aids in the collection of photo-generated carriers. A useful value of x in the intrinsic layer of lead-cadmium-sulphide lies between 0.3 and 0.6, with a suitable value being 0.4. The solutions used in spray pyrolysis to manufacture the form of the invention shown in FIG. 2 are the same as those in Example III, with the exception that the solution used in layer 14 omits the indium chloride used in the n-doped layer 6 and the antimony chloride used in the p-doped layer 8.

EXAMPLE V

Figure 3:
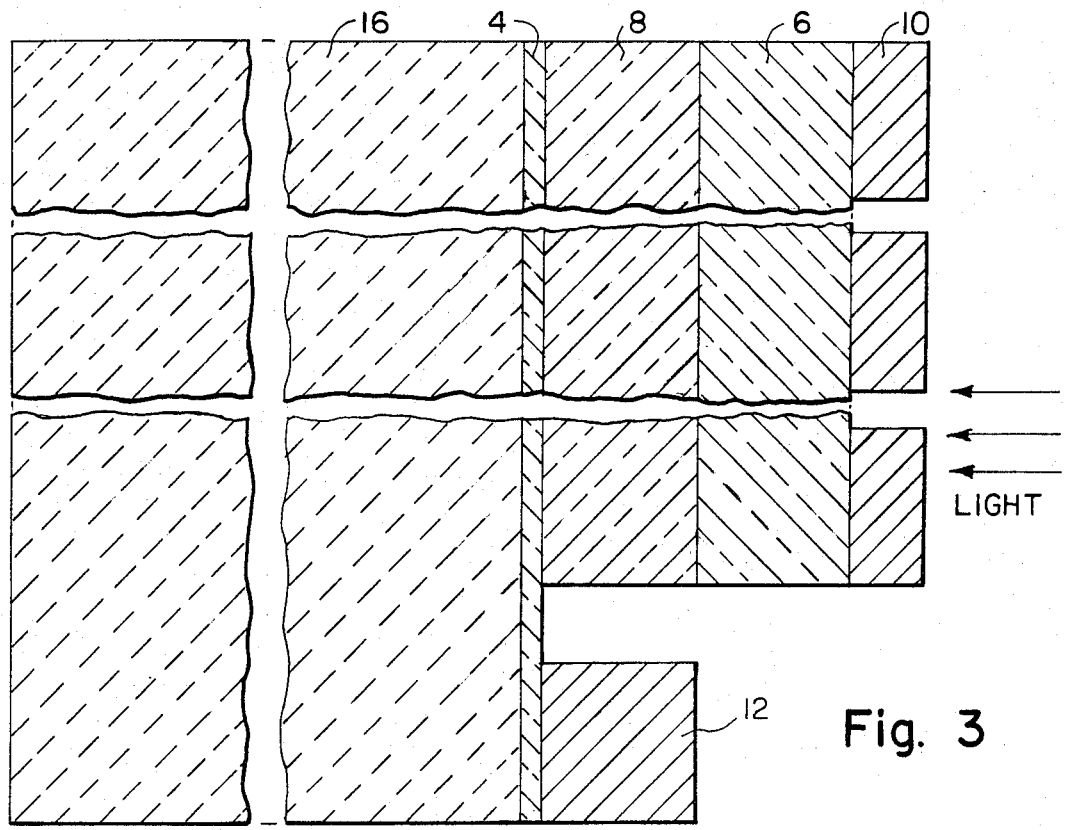
FIG. 3 is a diagrammatic view of a solar cell, similar to that shown in FIG. 1, formed on an opaque substrate.

It will be observed that, in the forms of the invention shown in FIGS. 1 and 2, the light enters each solar cell through a transparent substrate. This is necessary since the n-region electrode is tin oxide on glass and since it is an n-type semiconductor. In the case of a homojunction, the light can enter through either surface. This is shown in FIG. 3, where the p-doped layer 8 is in contact with the metal contact layer 4, which is supported on a ceramic or opaque metal substrate 16. In one form of the solar cell shown in FIG. 3, we employ the same solutions as shown in Example IV.

EXAMPLE VI

In this example, layer 6 may be cadmium sulphide, and not lead-cadmium-sulphide. Lead-cadmium-sulphide is formed in the same manner and with the same solution as is the formation of layer 8 in Examples IV and V. However, in this example, no lead acetate is used and the following solution forms cadmium sulphide:
0.006 molar Cadmium Acetate
0.00003 molar Indium Chloride
0.009 molar Thiourea

EXAMPLE VII

Figure 4:
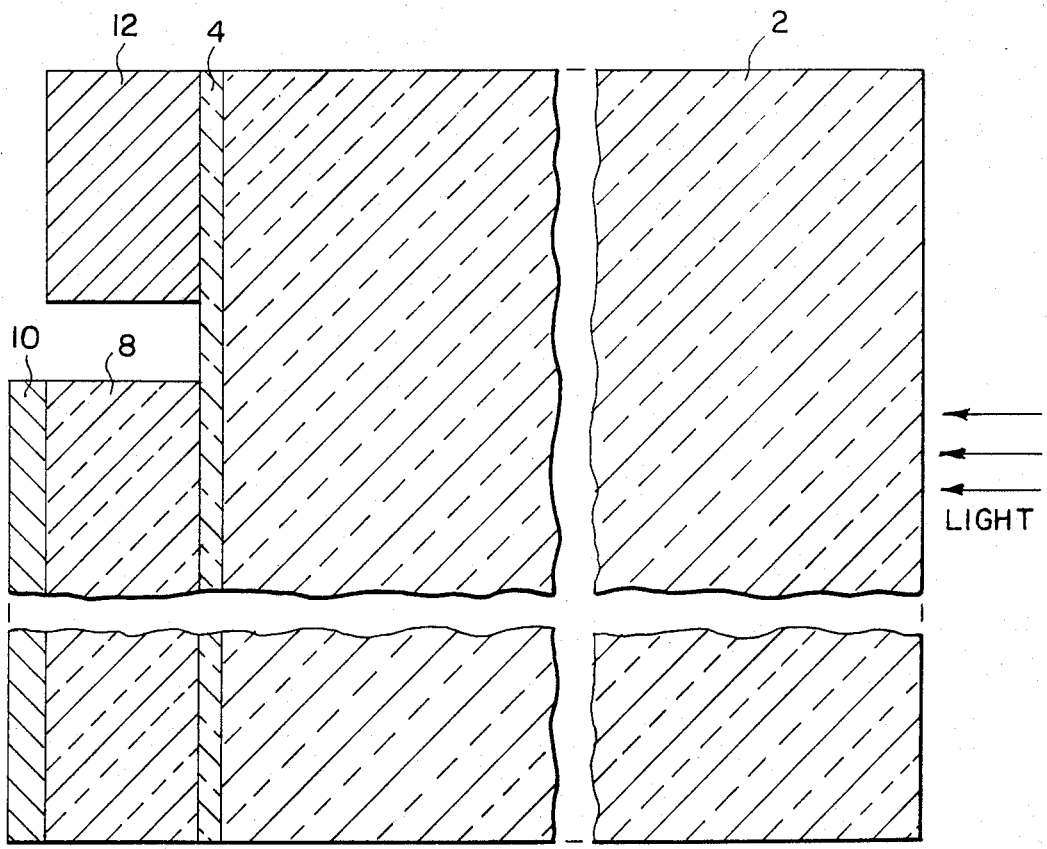
FIG. 4 is a diagrammatic view of a solar cell having a single semiconductor layer formed of lead-cadmium-sulphide alloy in combination with a metallic layer.

Referring now to FIG. 4, we have shown a heterojunction solar cell in which a thin, transparent, n-type semiconductor layer 4, such as cadmium sulphide, zinc oxide, tin oxide, indium oxide, or indium-tin oxide, is vacuum-evaporated or spray-pyrolyzed on the glass substrate 2 as in FIG. 1. The lead-cadmium-sulphide layer 8 is similar to layer 8 in FIG. 1 and is in contact with p-region contact 10. The n-region contact 12, which may be any electro-positive metal such as aluminum or indium, is in contact with the transparent n-type semiconductor layer 4. The solutions for forming lead-cadmium-sulphide by spray pyrolysis, described above, may be used, and the layer 8 is p-doped by antimony chloride as in Example VI. In the heterojunction solar cells described in this example, the lead-cadmium-sulphide sulphide is always p-doped, while cadmium sulphide, zinc oxide, tin oxide, indium oxide, or indium-tin oxide (ITO) is n-doped. It is to be understood that, while there may be problems with barriers or spikes in improperly designed heterojunctions, they offer the advantage of being able to inject light through the wide-gap material so that it may be absorbed in a narrow-gap material at the junction, at which point it will do the most good.

EXAMPLE VIII

Figure 5:
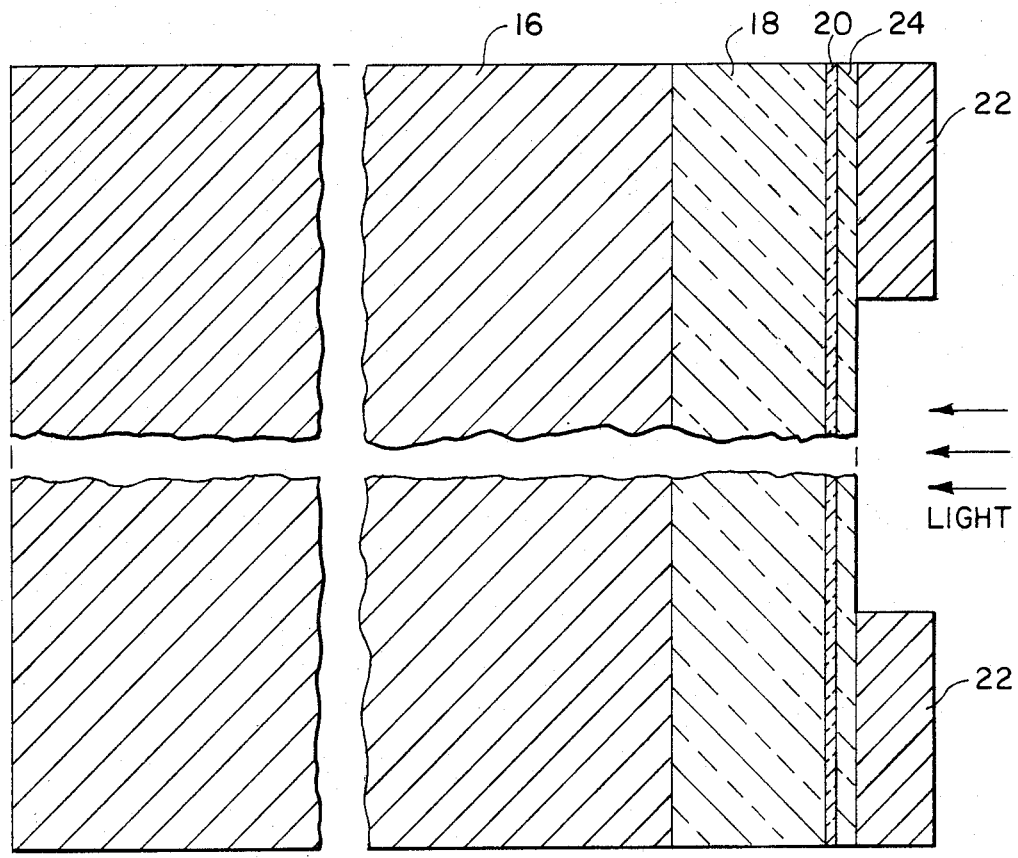
FIG. 5 is a diagrammatic view showing a Schottky-barrier or MIS (metal—insulator—semiconductor) solar cell.

Referring now to FIG. 5, we have shown a Schottky barrier or MIS (Metal-Insulator-Semiconductor) solar cell. As is known in the art, the first use of a semiconductor device was nothing more than a metal-semiconductor diode. It was employed as a detector of radio signals. A radio-signal rectifier was made by contacting a galena crystal (lead sulphide) with a metal whisker. This device was unreliable, since point-contact rectifiers were not reproducible. Later, these rectifiers were supplanted by p-n junction diodes. The theory of these junctions is now well understood, and it is possible to obtain both rectifying and non-rectifying M-S junctions. A non-rectifying junction has a low resistance drop, irrespective of the polarity of the externally applied voltage (ohmic contact). Since all semiconductor devices need ohmic contacts in order to employ them with other devices or in circuits, the rectifying junction became known as the Schottky-barrier diode.

In FIG. 5, layer 16 is similar to that shown in FIG. 3 and comprises a metallic or metallic-coated substrate. Layer 18 is a lead-cadmium-sulphide layer, in all respects identical with layer 8 in FIGS. 1, 2, 3, and 4. Layer 20 is an insulator layer, 10–100 Å thick, comprising $LaF_3$, $SiO_2$, $Si_3N_4$ or other insulator. It is understood that, while we have shown layer 18 to be a p-layer, it could be an n-layer. While the insulator layer 20 is preferably 100 Å thick, it could be present in a thickness as low as 10 Å. An optically transparent gold film 24, which it will be understood is used only with an n-doped lead-cadmium-sulphide layer, contacts film 20. If the semiconductor layer 18 were p-doped, the film 24 would be formed of aluminum. Grid contact to the film 24 is shown at 22. Contacts 22 are part of a grid formed of vacuum-deposited gold, nickel, or chromium, having a thickness between 1 and 5 microns, being 15 microns wide, and deposited between contacts a distance of 150 microns.

It will be understood that the narrower the band gap of the semiconductor, the more photons will be absorbed. The following table shows the known and calculated band gaps of various cadmium compounds, as well as a lead compound and alloys of lead-cadmium-sulphide:

| Known and Calculated Band Gaps | |
|---|---|
| | Band Gap |
| Compounds | |
| CdS hexagonal (Wurtzite form) | 2.42 |
| CdS cubic (Sphalerite form) | 2.42 |
| CdS cubic (Rock salt form) | 1.5 |
| PbS cubic (Rock salt form) [galena] | 0.4 |
| Alloys | |
| $Pb_{0.5}Cd_{0.5}S$ | |
| Rock salt form CdS | 0.95 |
| Hexagonal CdS | 1.4 |
| $Pb_{0.4}Cd_{0.6}S$ | |
| Rock salt form CdS | 1.06 |
| Wurtzite form CdS | 1.6 |

It will be observed that hexagonal cadmium sulphide (Wurtzite) has a band gap of 2.42. When used as an alloy with lead, the band gap is decreased to 1.4. Similarly, cubic cadmium sulphide (rock salt) has a band gap of 1.5; while an alloy of cadmium-sulphide-rock-salt has a band gap of 0.95.

It will also be observed that the band gap of lead-cadmium-sulphide varies as a function of x in the formula $Pb_xCd_{(1-x)}S$. This is shown diagrammatically in FIG. 7.

Joseph J. Loferski studied the theory of the photovoltaic effect to predict the characteristics of a semiconductor which would operate with optimum efficiency as a photovoltaic solar energy converter. He published a paper in the *Journal of Applied Physics*, Volume 27, No. 7, in July of 1956, extending from page 777 through page 784. One of his conclusions was that semiconductors in which $E_G$ lay between 1.1 ev and 1.6 ev would be most likely to give the maximum efficiency—that is, the ratio of maximum electrical power output to solar power arriving at a unit area.

Figure 7:
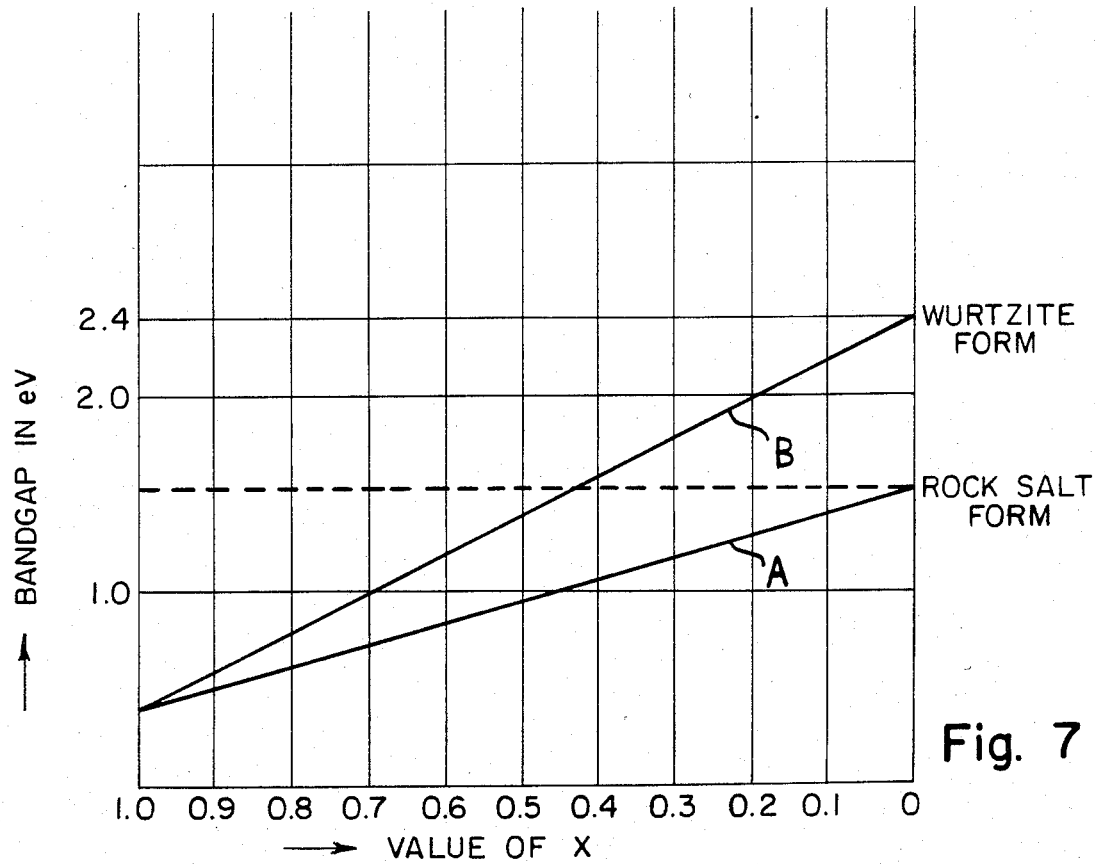
FIG. 7 is a chart showing the variation of band gap plotted against x in the lead-cadmium-sulphide alloy $(Pb_xCd_{(1-x)}S)$.

The dotted line in FIG. 7 represents band gap shown in eV. Curve A represents a variation of band gap as a function of x in lead-cadmium-sulphide alloy having the formula $Pb_xCd_{(1-x)}S$ where the cadmium sulphide in the alloy has a cubic—i.e., a rock salt—form. The curve shows that, in this form, the lead-cadmium-sulphide alloy never reaches the optimum band gap of 1.5 eV. Curve B is similar to Curve A. The cadmium sulphide in the alloy, however, is in hexagonal (Wurtzite) form. Accordingly, while lead-cadmium-sulphide alloy with the cadmium sulphide in the cubic form will produce a solar cell, that cell will not possess maximum efficiency. Our solar cell will produce an open-circuit voltage of about 1 volt. This, of course, will vary as a function of atmospheric conditions. The maximum voltage will become smaller as absorption of solar radiation by the earth's atmosphere increases. It is interesting to note that one of the conclusions of Loferski was that a CdS photovoltaic cell would not be as good as silicon. He also reports that CdTe has a maximum efficiency of 24 percent. The expense of making a silicon solar cell is great, as pointed out above; while applicants' invention enables an efficient solar cell to be made cheaply. Furthermore, its band gap with cadmium sulphide in hexagonal form lies between 1.4 and 1.6, which is in the zone of greatest efficiency.

We have found that lead-cadmium-sulphide layers which have been p-doped with Group V elements, such as antimony, arsenic, and other acceptors, require heat treatment to impart maximum efficiency to the thin film. We have not been able to ascertain the length of time that heat treatment is necessary. Accordingly, when the cell has been completed, we heat-treat it at temperatures between 200° C. and 500° C. for a period of time. We have heat-treated cells for 16 hours at 300° C. and find that good results are achieved.

It will be seen that we have accomplished the objects of our invention. We have provided a solar cell formed of a semiconductor which has an ideal band gap for solar absorption. Our solar cell comprises lead-cadmium-sulphide alloy, having the general formula $Pb_xCd_{(1-x)}S$, in which x lies between 0.3 and 0.7. We have provided a multilayer solar cell which may be made inexpensively and which is formed of a homojunction of two layers of lead-cadmium-sulphide alloy, in which one of the layers is doped p-type and the other of the layers is doped n-type. We have provided a novel method of making solar cells using lead-cadmium-sulphide. We are enabled to use lead-cadmium-sulphide to produce solar cells having the following configurations: Homojunctions, heterojunctions, PIN, and MIS. We are enabled to use lead-cadmium-sulphide in combination with an opaque substrate or a transparent substrate, as desired. We have provided a lead-cadmium sulphide solar cell having an interface with a layer of cadmium sulphide, zinc oxide, tin oxide, indium oxide, or indium-tin oxide. Since we are enabled to use lead-cadmium-sulphide in a multilayer solar cell, we avoid the problems usually associated with a heterojunction.

It will be understood that certain features and subcombinations are of utility and may be employed without reference to other features and subcombinations. This is contemplated by and is within the scope of our claims. It is further obvious that various changes may be made in details within the scope of our claims without departing from the spirit of our invention. It is, therefore, to be understood that our invention is not to be limited to the specific details shown and described.

Having thus described our invention, what we claim is:

1. A solar cell comprising a film of lead-cadmium-sulphide alloy having the formula $Pb_xCd_{(1-x)}S$ where x lies between 0.3 and 0.7.

2. A solar cell as in claim 1 in which said lead-cadmium-sulphide film is supported on a transparent substrate.

3. A solar cell as in claim 1 in which said lead-cadmium-sulphide film is supported on an opaque substrate.

4. A solar cell as in claim 1 in which said lead-cadmium-sulphide film is supported on a metal substrate.

5. A solar cell comprising a homojunction of two films of lead-cadmium-sulphide alloy having the formula $Pb_xCd_{(1-x)}S$ where x lies between 0.3 and 0.7, one of said films being p-doped and the other of said films being n-doped.

6. A solar cell as in claim 5 including in combination a transparent substrate.

7. A solar cell as in claim 5 including in combination an opaque substrate.

8. A solar cell comprising two films forming a heterojunction, one of said films including lead-cadmium-sulphide alloy having the formula $Pb_xCd_{(1-x)}S$ where x lies between 0.3 and 0.7, said alloy being p-doped, and the other of said films being in contact with said alloy film and comprising n-doped cadmium sulphide.

9. A solar cell comprising two films forming a heterojunction, one of said films including lead-cadmium-sulphide alloy having the formula $Pb_xCd_{(1-x)}S$ where x lies between 0.3 and 0.7, said alloy being p-doped, and the other of said films being in contact with said alloy film and comprising n-doped zinc oxide.

10. A solar cell comprising two films forming a heterojunction, one of said films including lead-cadmium-sulphide alloy having the formula $Pb_xCd_{(1-x)}S$ where x lies between 0.3 and 0.7, said alloy being p-doped, and the other of said films being in contact with said alloy film and comprising n-doped tin oxide.

11. A solar cell comprising two films forming a heterojunction, one of said films including lead-cadmium-sulphide alloy having the formula $Pb_xCd_{(1-x)}S$ where x lies between 0.3 and 0.7, said alloy being p-doped, and the other of said films being in contact with said alloy film and comprising n-doped indium oxide.

12. A solar cell comprising two films forming a heterojunction, one of said films including lead-cadmium-sulphide alloy having the formula $Pb_xCd_{(1-x)}S$ where x lies between 0.3 and 0.7, said alloy being p-doped, and the other of said films being in contact with said alloy film and comprising n-doped indium-tin oxide.

13. A solar cell comprising three films of lead-cadmium-sulphide alloy having the formula $Pb_xCd_{(1-x)}S$ where x lies between 0.3 and 0.7, assembled in the following order: a film doped n-type, a film of the intrinsic alloy, and a film doped p-type.

* * * * *